United States Patent [19]

Huh

[11] Patent Number: 5,309,209
[45] Date of Patent: May 3, 1994

[54] HEAT-FIXING APPARATUS FOR COLOR VIDEO PRINTER INCLUDING A STATIONARY HEAT TUBE

[75] Inventor: Byung M. Huh, Seoul, Rep. of Korea

[73] Assignee: Goldstar Co., Ltd., Seoul, Rep. of Korea

[21] Appl. No.: 855,604

[22] Filed: Mar. 20, 1992

[30] Foreign Application Priority Data

Mar. 21, 1991 [KR] Rep. of Korea ............... 4458/1991
May 4, 1991 [KR] Rep. of Korea ............... 7265/1991
May 7, 1991 [KR] Rep. of Korea ............... 7358/1991
Dec. 26, 1991 [KR] Rep. of Korea ............... 24076/1991

[51] Int. Cl.⁵ ............................................. G03G 15/20
[52] U.S. Cl. ............................................. 355/285; 355/282
[58] Field of Search ............... 355/282, 285, 289, 290, 355/291, 295, 204, 208, 308, 309, 219; 219/216

[56] References Cited

U.S. PATENT DOCUMENTS

| | | |
|---|---|---|
| Re. 33,770 | 12/1991 | Torino et al. .................... 355/290 |
| 4,045,165 | 8/1977 | Nakajima et al. . |
| 4,200,389 | 4/1980 | Matsui et al. .................... 355/295 |
| 4,355,881 | 10/1982 | Tarumi et al. .................... 355/282 |
| 4,770,545 | 9/1988 | Takada et al. .................... 374/208 |
| 4,933,724 | 6/1990 | Sugimoto et al. ................ 355/289 |
| 4,949,130 | 8/1990 | Torino ................................ 355/282 |
| 4,963,943 | 10/1990 | Tamary ............................. 355/290 |
| 5,030,540 | 7/1991 | Sangyoji et al. . |
| 5,051,780 | 9/1991 | Stelter .............................. 355/208 |
| 5,155,534 | 10/1992 | Kurotori et al. . |

FOREIGN PATENT DOCUMENTS

0393592  10/1990  European Pat. Off. .

Primary Examiner—A. T. Grimley
Assistant Examiner—Sandra L. Brase
Attorney, Agent, or Firm—Fliesler, Dubb, Meyer & Lovejoy

[57] ABSTRACT

A heat-fixing apparatus for a color video printer. The heat-fixing apparatus comprises a heating member for heating an under surface of a receiver paper, thereby heat-fixing an image which has been developed on the receiver paper, and receiver paper feeding and discharging member for feeding the receiver paper, the receiver paper having been processed at a developing process, under the condition that the under surface thereof closely contact with the heating member, and discharging the receiver paper which has been processed at a heat-fixing process. The heating member comprises a rotary type heat roller, a stationary type heat tube or a stationary type heat cover plate. The heat-fixing apparatus of this invention provides advantages in that it makes an under surface of the receiver paper to closely contact with the outer surface of the heat member, reliably prevents rollers such as compression roller from being stained with dyestuff of color image on the receiver paper, improves a heat efficiency of the heat source thereof and uniformly performs the heat-fixing operation for the receiver paper.

24 Claims, 13 Drawing Sheets

HEAT-FIXING APPARATUS FOR COLOR VIDEO PRINTER INCLUDING A STATIONARY HEAT TUBE

BACKGROUND OF THE INVENTION

1. Field of the Invention

The present invention generally relates to a color video printer, such as a cycolor type color video printer, and more particularly to a heat-fixing apparatus for such a color video printer which reliably prevents rollers such as compression roller from being stained with dyestuff of color image on a receiver paper, improves a heat utilization efficiency of a heat source thereof and uniformly performs the heat-fixing operation for the receiver paper.

2. Description of the Prior Art

With reference to FIG. 1 which shows an operational principle of a heat-fixing operation by a known heat-fixing apparatus for a cycolor type color video printer, the cycolor film 2 which is applied with a great number of cylith capsules 1 is exposed, by using a light-exposing apparatus such as a F/O CRT (Fiber Optics Cathode Ray Tube), to an image light corresponding to an optical image which is to be printed on a receiver paper. In result, a part of the cylith capsules 1 which were exposed to the image light are cured owing to a high photosensitivity thereof while the other cylith capsules 1 which were not exposed to the image light remains as in previous liquid state.

Sequentially, a receiver paper 5 comprising a paper base 4 being covered with a resin layer 3 passes through a pair of developing rollers, that is, upper and lower developing rollers 6, under the condition that it overlaps with the light-exposed cycolor film 2. At this time, the cylith capsules 1 which were not exposed to the image light are broken due to a substantially high pressure generating between the upper and lower developing rollers 6 so that the dyestuff of the broken cylith capsules 1 is transferred onto the receiver paper 5. That is, the resin layer 3 of the receiver paper 5 is applied with the dyestuff of the broken cylith capsules 1.

Thereafter, the receiver paper 5 out of the upper and lower developing rollers 6 is heated by a heat-fixing apparatus 7. In result, the resin layer 3 of the receiver paper 5 is fused in order to react upon the dyestuff having been applied on the receiver paper 5, thereby causing the color image to be heat-fixed on the receiver paper 5.

There have been proposed several types of conventional heat-fixing apparatus for a cycolor type color video printer for heat-fixing a color image on a receiver paper in accordance with the above-mentioned heat-fixing operational principle. Hereinafter, two types of conventional heat-fixing apparatus as examples will be described in conjunction with accompanying drawings, respectively.

Referring to FIG. 2 which shows a sectional view of an embodiment of a conventional contact type heat-fixing apparatus for a color video printer, the contact type apparatus comprises a heat roller 12 enclosing therein a halogen lamp 10 as a heat source and being coated at circumferential outer surface thereof with a teflon layer 11, and a compression roller 14 being coated at circumferential outer surface thereof with a silicon rubber 13 and adapted for contacting with the outer surface of the heat roller 12 at a predetermined pressure. In addition, there are provided a pair of separating members 16, each disposed at each roller 12, 14 and adapted for smoothly separating the receiver paper 15 from the roller 12, 14, and an oil supplying member comprising an oil reservoir 17 for containing oil which is to be supplied to the heat roller 12 during the heat-fixing operation, and an oil feeding tube 18 for allowing the oil of the oil reservoir 17 to be supplied to the heat roller 12 therethrough. Therefore, the color image on the receiver paper 15 is heat-fixed during the receiver paper 15 passes through the heat and compression rollers 12 and 14, then the receiver paper 15 out of the rollers 12 and 14 is smoothly separated from the rollers 12 and 14 by means of the separating members 16. At this time, the heat roller 12 is continuously supplied with the oil by means of the oil supplying member 17 and 18.

On the other hand, FIG. 3 shows a perspective view of an embodiment of a conventional non-contact type heat-fixing apparatus for a color video printer. As shown in the drawing, the conventional non-contact type apparatus comprises two pairs of upper and lower feed rollers 21, 22 and 23, 24 disposed such that the two pairs 21, 22 and 23, 24 are spaced from each other pair by a predetermined distance, and the upper and lower rollers 21 and 22, 23 and 24 of each pair contact with each other at a predetermined pressure. In addition, there are provided a halogen lamp 25 disposed between the upper feed rollers 21 and 23 of the two pairs in order to act as a heat source, and a reflector 26 surrounding the halogen lamp 25 in order to concentrate the heat generated by the halogen lamp 25.

In such a conventional non-contact type heat-fixing apparatus, the upper feed rollers 21 and 23 are connected to each other by means of a endless belt 27 wrapping thereabout in order to interlock with each other, thereby feeding the receiver paper 20 so as to pass under the reflector 26. At this time, the receiver paper 20 is supplied with the heat which is generated by the halogen lamp 25 and then concentrated by the reflector 26, thereby causing the color image having transferred on the receiver paper 20 to be heat-fixed.

However, in the conventional non-contact type heat-fixing apparatus as shown in FIG. 3, the heat-fixing apparatus has a substantially lower heat utilization efficiency so that it must be necessary to increase the temperature of the halogen lamp 25 to a substantially higher temperature. In result, the conventional non-contact type heat-fixing apparatus has a disadvantage in that in case of increasing the temperature of the halogen lamp 25 to such a high temperature, it can not reliably provide a stability such as due to occurrence of ignition of the receiver paper 20, occurrence of a danger that the whole system of the apparatus is subjected to an undesirable high temperature atmosphere, and an evaporation of moisture from the receiver paper 20, resulting in causing the receiver paper 20 to be rolled, thus occurring a paper jam.

On the other hand, in the conventional contact type heat-fixing apparatus as shown in FIG. 2, even though it is possible to provide a relatively good stability, it has a disadvantage in that is needs a substantially long warming time for accomplishing a desired temperature for reliably performing the desired heat-fixing operation. In addition, the heat roller 12 of this type of heat-fixing apparatus has to directly and closely contact with the color image on the receiver paper 15, thereby introducing another disadvantage of occurrence of an offset of dyestuff in which the heat roller 12 is stained with the dyestuff of the cylith capsules.

SUMMARY OF THE INVENTION

It is, therefore, an object of the present invention to provide a heat-fixing apparatus for a color video printer which prevents such an offset of the dyestuff, thereby performing a uniform and clear heat-fixing operation for the dyestuff of color image on a receiver paper, thus causing a high lustrous color image to be obtained.

It is another object of the present invention to provide a heat-fixing apparatus for a color video printer which makes a heating member thereof to be continuously maintained at a predetermined temperature, and is provided with an additional heating member which is to be operated as required, thereby improving the operational effect of the heat-fixing operation.

It is still another object of the present invention to provide a heat-fixing apparatus for a color video printer which makes the receiver paper to be subjected to the heat-fixing operation under the condition that an under surface thereof closely contacts with the heating member, and also to be easily separated from the heating member.

The above-mentioned objects of the present invention are accomplished by providing a heat-fixing apparatus for a color video printer comprising: heating means for heating an under surface of a receiver paper, thereby heat-fixing an image which has been developed on said receiver paper; and receiver paper feeding and discharging means for feeding the receiver paper, said receiver paper having been processed at a developing process, under the condition that said under surface thereof closely contact with said heating means, and discharging the receiver paper which has been processed at a heat-fixing process.

In accordance with an embodiment of the present invention, the heating means comprises a rotary type heat roller enclosing a heat source therein, and also said receiver paper feeding and discharging means comprises: upper and lower paper feed guide plate members for guiding the receiver paper, said receiver paper having been processed at said developing process, to an upper surface of said heating means, respectively; a first electrification member for electrifying said receiver paper with a predetermined polarity in order to make said receiver paper be fed under the condition that an under surface thereof to closely contact with a paper contact part of said heating means with which said receiver paper contacts; a second electrification member for electrifying said heating means with an opposite polarity to that of said receiver paper; and paper separating members for separating said receiver paper which has been processed at the heat-fixing process from said heating means, then discharging said receiver paper.

In accordance with another embodiment of the present invention, the heating means comprises a stationary type heat tube enclosing a heat source therein, and also said receiver paper feeding and discharging means comprises: upper and lower paper feed guide plate members for guiding the receiver paper, said receiver paper having been processed at said developing process, to an upper surface of said heating means, respectively; an electrification member for electrifying said receiver paper with a predetermined polarity in order to make said receiver paper be fed under the condition that an under surface thereof to closely contact with a paper contact part of said heating means with which said receiver paper contacts; and upper and lower paper discharge rollers for forcedly drawing the receiver paper having been processed at said heat-fixing process, and separating said receiver paper from said heating means in order to discharge said receiver paper from said heat-fixing apparatus.

In accordance with still another embodiment of the present invention, the heating means comprises a rotary type heat roller enclosing a heat source therein, and also said receiver paper feeding and discharging means comprises: upper and lower paper feed guide plate members for guiding the receiver paper to a contact part of said heat roller; a lower paper discharge guide plate member for guiding a paper discharge of said receiver paper at a lower position of said contact part of the heat roller; an insulation part for insulating a part of said heat roller in order to cut off a heat transfer to both margins of said receiver paper, said insulation part being integrally formed with said heat roller and having the same outer diameter as that of a center contact part of the heat roller; a compression roller for making said both margins of the receiver paper to closely contact with said insulation part of the heat roller, said compression roller being disposed on said heat roller; upper and lower paper discharge rollers for discharging the receiver paper which has been processed at said heat-fixing process and is guided by said lower paper discharge guide plate member; and paper discharge guide means for automatically separating said receiver paper which has passed through said paper discharge rollers from said paper discharge rollers, and discharging said receiver paper from the heat-fixing apparatus.

In accordance with still another embodiment of the present invention, the heating means comprises a rotary type heat roller enclosing a heat source therein, and also said receiver paper feeding and discharging means comprises: a belt guide roller being disposed in order to be spaced apart from said heat roller being disposed in order to be spaced apart from said heat roller by a predetermined distance; an endless plate belt being connected between said belt guide roller and said heat roller; a compression roller for pressing an image transferred part of said receiver paper to said endless plate belt wrapping about said heat roller by using a biasing force of a compression member; a paper feed guide plate member for supporting said receiver paper to closely contact with said endless plate belt between said heat roller and said belt guide roller; a blower for circulating an air current at a lower part of said paper feed guide plate member in order to cool said receiver paper; and power transmission means for driving said heat roller, said belt guide roller and said compression roller.

BRIEF DESCRIPTION OF THE DRAWINGS

The above and other objects, features and other advantages of the present invention will be more clearly understood from the following detailed description taken in conjunction with the accompanying drawings, in which:

FIGS. 14 to 18 are views of still another embodiment of that heat-fixing apparatus for the color video printer in accordance with the present invention, respectively, in which:

FIG. 14 is a side view of a heat roller of the heat-fixing apparatus;

FIG. 15 is a side view of a compression roller of the heat-fixing apparatus;

FIG. 16 is a sectional view of the heat-fixing apparatus;

FIG. 17 is a sectional view taken along the section line A—A or FIG. 16; and

FIG. 18 is a perspective view of the heat-fixing apparatus of FIG. 16;

FIGS. 20 to 22 are views of still another embodiment of a heat-fixing apparatus using the belt contact type heat-fixing principle in accordance with the present invention, respectively, in which:

FIG. 20 is a sectional view;

FIG. 21 is a plane view; and

FIG. 22 is a perspective view;

DESCRIPTION OF THE PREFERRED EMBODIMENTS

Figure 1:
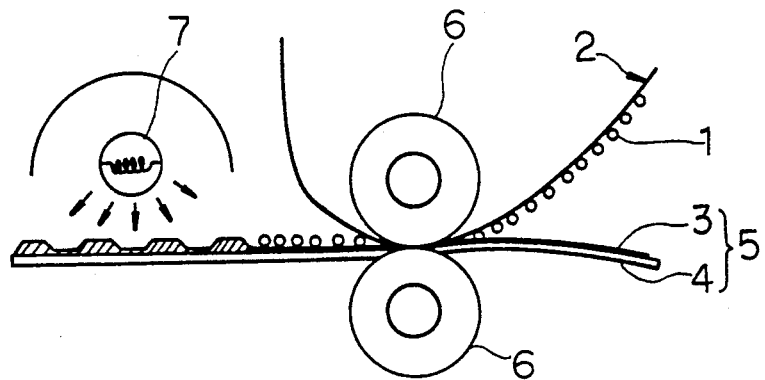
FIG. 1 is a schematic view showing an operational principle of a heat-fixing operation of a color video printer in accordance with the prior art.
Figure 2:
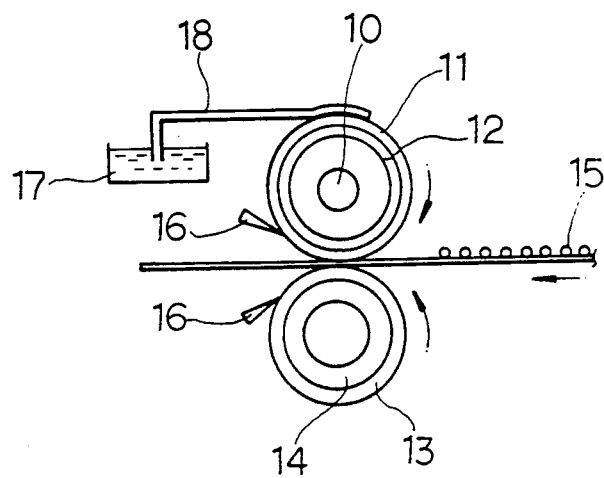
FIG. 2 is a sectional view of an embodiment of contact type heat-fixing apparatus for a color video printer in accordance with the prior art.
Figure 3:
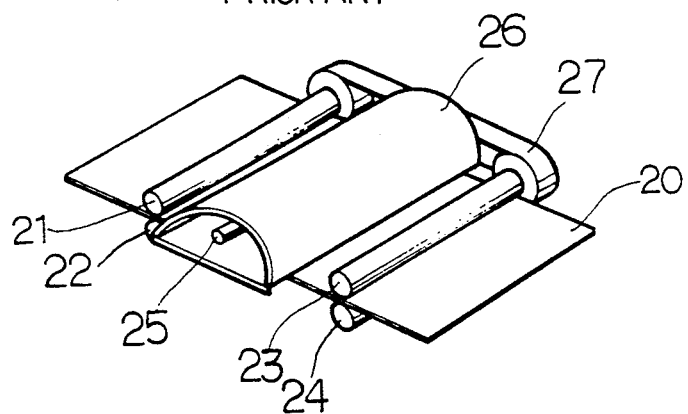
FIG. 3 is a perspective view of an embodiment of non-contact type heat-fixing apparatus for a color video printer in accordance with the prior art.
Figure 4:
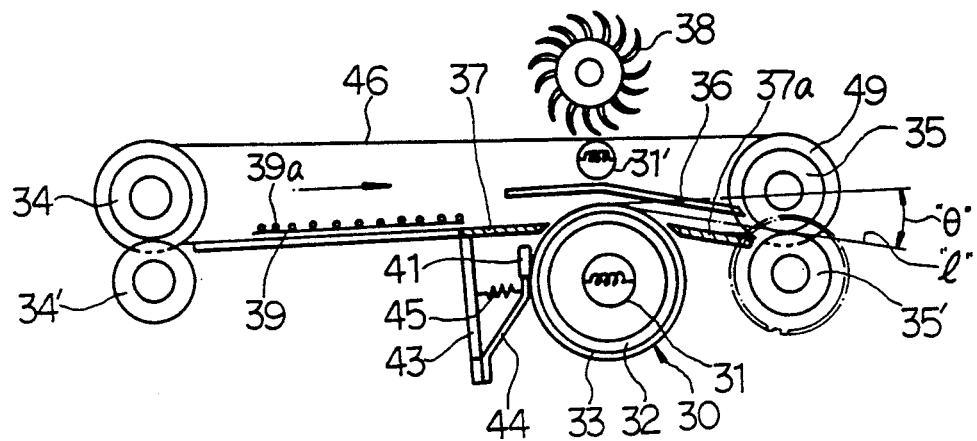
FIG. 4 is a sectional view of an embodiment of heat-fixing apparatus for a color video printer in accordance with the present invention.
Figure 5:
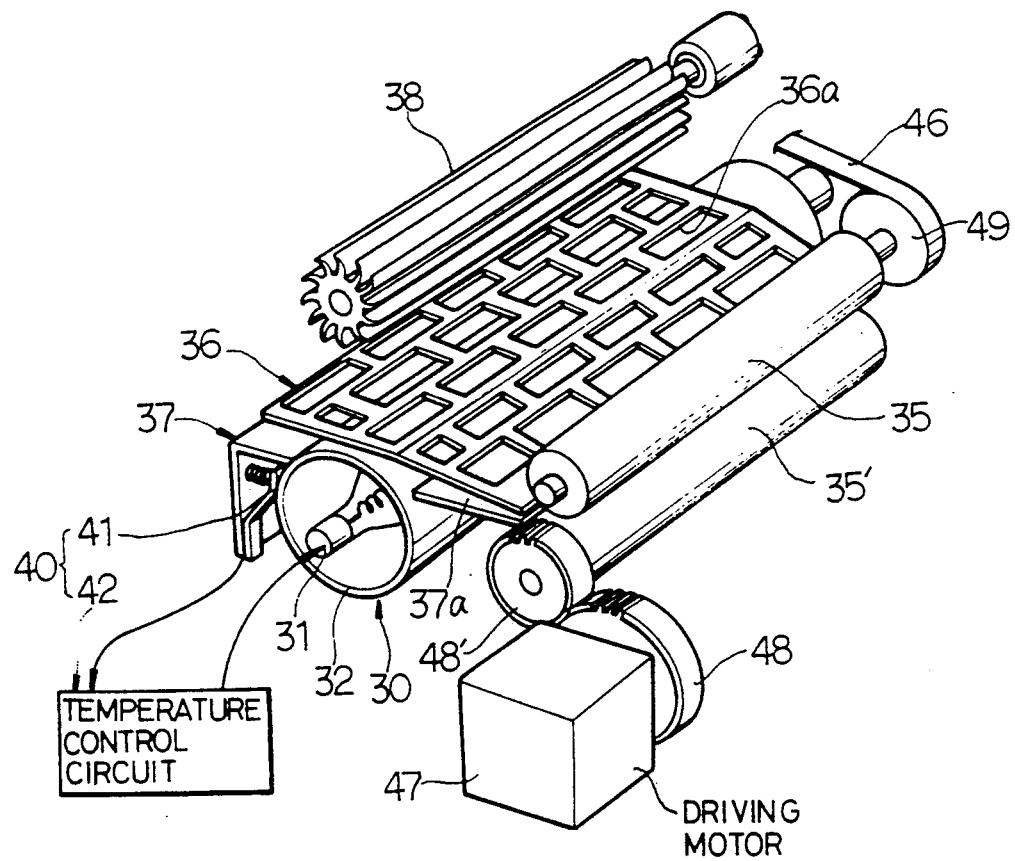
FIG. 5 is a perspective view of the heat-fixing apparatus for FIG. 4.

With reference to FIGS. 4 and 5 which are a sectional view and a perspective view of a first embodiment of heat-fixing apparatus for a color video printer in accordance with the present invention, respectively, the apparatus comprises a heating member 30, that is, a heat roller 32 which encloses a heat source 31 therein and rotatably mounted between a pair of paper feed rollers 34 and 34', both disposed at a paper inlet side, and a pair of paper discharge rollers 35 and 35', both disposed at a paper outlet side. Upper and lower paper feed guide plate members 36 and 37 are disposed at opposite sides of a paper contact part of the heat roller 32. In result, this type of heat-fixing apparatus heat-fixes a receiver paper 39 by an under surface contact type heat-fixing operation such that the receiver paper 39 applied thereon with a great number of cylith capsules 39a is fed with contacting the under surface thereof with the heat roller 32 and also is heat-fixed by the heat-fixing apparatus.

The paper feed rollers 34 and 34' and the paper discharge rollers 35 and 35' are cooperated with each other in such a manner that the upper rollers 34 and 35 are connected to each other by means of an endless belt 46 and cooperated with each other by a rotating power of a driving motor 47. In accordance with the rotation of the paper feed and paper discharge rollers 34, 34', 35 and 35', the receiver paper 39 is fed by virtue of a frictional force generated between each pair of rollers 34 and 34', 35 and 35'.

The paper discharge rollers 35 and 35' are disposed so as to be located at a position lower than that of the heat roller 32, so that an assumed straight line connecting the upper end of the heat roller 32 to the upper end of the lower paper discharge roller 35' is downwardly inclined with respect to the horizontal line at a predetermined angle of inclination θ. In addition, the lower paper feed guide plate member 37 has a paper discharge and 37a which is disposed so as to be downwardly inclined with respect to the horizontal line. In result, there occurs a tension in the receiver paper 39 which is moving on the heat roller 32 and the lower paper discharge roller 35', thereby causing the receiver paper 39 to move under the condition of wide and closely contacting with the heat roller 32.

The heat roller 32 is coated at the outer surface thereof with a teflon layer 33 in order to reduce the frictional force which is to be transmitted to the receiver paper 39, and also to provide the roller 32 with a smooth contact surface which causes the receiver paper 39 to uniformly contact thereto.

In addition, the heat roller 32 is constructed such that it is continuously maintained at a predetermined temperature by means of a temperature control member 40. The control member 40 comprises a temperature sensor 41 which always contacts with a part of the heat roller 32 in order to sense the temperature of the heat roller 32, and a temperature control circuit 42 for turning on and off the heat source 31 of the heating member 30 in accordance with the sensed temperature of the heat roller 32.

The temperature sensor 41 has to be disposed in order to closely contact with the heat roller 32. In result, the sensor 41 is mounted on an upper end of an elastic supporter 44 which is connected at a lower end thereof to a stationary supporter 43 downwardly extending from the lower paper feed guide member 37. In addition, there is provided a compression coil spring 45 between the stationary and elastic supporters 43 and 44 in order to bias the elastic supporter 44, thereby causing the temperature sensor 41 to be biased toward the heat roller 32.

On the other hand, the upper paper feed guide member 36 includes a plurality of holes 36a, preferably formed as rectangular holes, and is constructed of a metal plate, a synthetic resin plate or a metal net. An additional heat source 31' is preferably provided above the upper paper feed guide member 36 in order to make the heat-fixing velocity to be more rapid, and a blower 38 is installed above the additional heat source 31'. Here, the heat sources 31 and 31' are selected from a heat lamp such as a conventional halogen lamp.

On the other hand, the paper feed rollers 34 and 34' conventionally acts as the compression developing rollers for performing the developing operation.

In the drawings, FIGS. 4 and 5, the reference number 39a denotes the cylith capsules, the numbers 48 and 48' denote gears, respectively, and the number 49 denotes a belt pulley.

The operational effect of the heat-fixing apparatus having the above construction will be described as follows.

Referring again to FIG. 4, the receiver paper 39 on which the color image of a cycolor film has been transferred at the developing process is fed by means of the frictional force generated between the paper feed rollers 34 and 34' and generated between the paper discharge rollers 34 and 35' when the rollers 34, 34', 35 and 35' rotate in friction, respectively. At this time, the receiver paper 39 closely contacts at the under surface thereof with the heat roller 32, thereby being heated by the heat roller 32, thus causing the color image thereon to be heat-fixed.

If there occurs an unbalanced heat-fixing during such a fixing operation, the additional heat source 31' and blower 38 are turned on, respectively, thereby forcedly introducing the hot air current, generated by the additional heat source 31' and circulated by the blower 38, to the upper surface of the receiver paper 39 through the holes 36a of the upper paper feed guide member 36. In result, the upper surface of the receiver paper 39 is heated, thus the heat-fixing operation is uniformly carried out across the receiver paper 39.

After accomplishing the heat-fixing process, the heat sources 31 and 31' are turned off, while the blower 38 is only driven in order to cool the system.

As described above, the heat-fixing apparatus makes the heat-fixing operation to be performed only by the heat roller 32 so that it is provided with no compression roller, different from a contact type heat-fixing apparatus according to the prior art. In result, the heat-fixing apparatus of this invention provides advantage in that it efficiently prevents occurrence of the offset of the dyestuff of the cylith capsules. In addition, the heat-fixing apparatus of this invention improves the heat utilization efficiency due to accomplishing the under surface contact type heat-fixing operation, thereby providing another advantage in that the color image on the receiver paper 39 is heat-fixed at a relatively lower temperature, resulting in reducing the required electric power and also improving the stability of the heat-fixing operation.

Furthermore in case of occurrence of unbalanced heat-fixing, the additional heat source 31' besides the main heat source 31 is driven and also the blower 38 is driven in order to provide the hot air current for the upper surface of the receiver paper 39 as described above, thereby causing the color image of the receiver paper 39 to be uniformly heat-fixed.

Figure 7A:
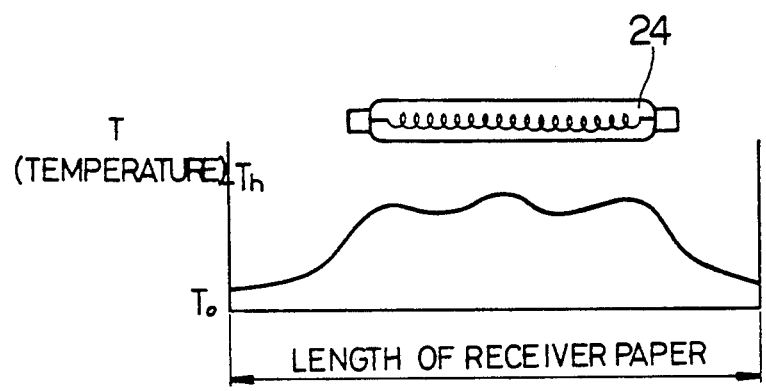
FIGS. 7A and 7B are graphs showing different temperature distributions on a receiver paper in case of heat-fixing operations by means of a conventional non-contact type heat-fixing apparatus and an under surface contact type heat-fixing apparatus in accordance with the present invention, respectively.
Figure 7B:
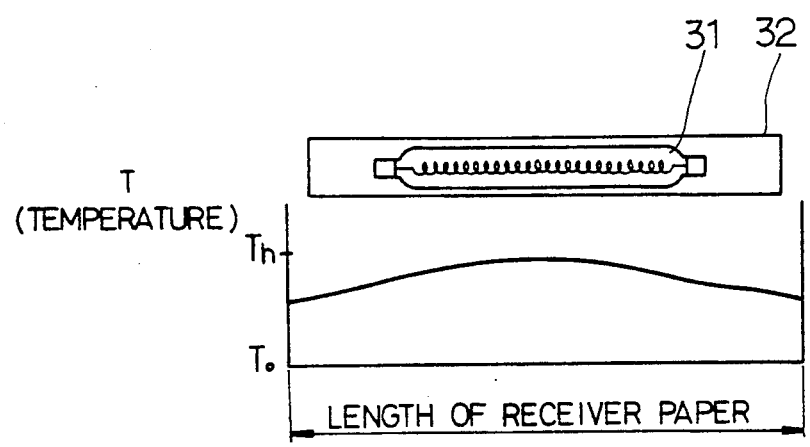

On the other hand, while a conventional non-contact type heat-fixing apparatus has a disadvantage in that it has unstable temperature distribution due to characteristics of the halogen lamp and an influence of a convection current (see FIG. 7A), the under surface contact type heat-fixing apparatus of this invention provides an advantage in that it heats the under surface of the receiver paper 39 by means of the heat roller 32, thereby providing a stable temperature distribution and thus providing a good heat-fixing result (see FIG. 7B).

Figure 6A:
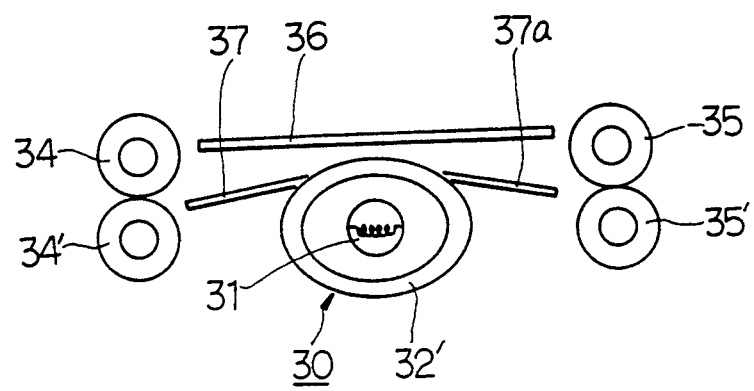
FIGS. 6A and 6B are sectional views of different embodiments of a heating member of the heat-fixing apparatus for color video printer in accordance with the present invention, respectively.
Figure 6B:
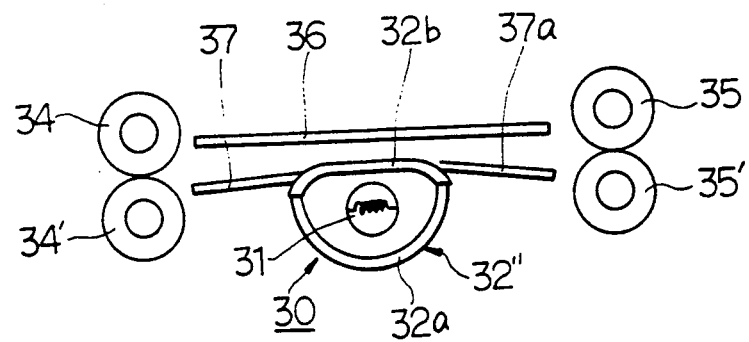

FIGS. 6A and 6B are sectional views of second and third embodiments of a heating member 30 of the heat-fixing apparatus in accordance with the present invention, respectively. As described in the drawings, the heating member 30 may comprise a stationary type heating member instead of the above-mentioned rotary type heating member 30 comprising the cylindrical heat roller 32 shown in FIGS. 4 and 5.

In other words, the heating member 30 may comprise an elliptical heat tube 32' enclosing the main heat source 31 as described in FIG. 6A, or may comprise a cover type heat tube 32" which results from combination of a planar heat cover 32b on a hemispherical heat cover 32a and encloses the main heat source 31 therein.

Of course in case of the heating member 30 comprising the stationary type instead of the rotary type, the heating member 30 may have other shapes besides the shapes shown in FIGS. 6A and 6B.

The above-mentioned under surface contact type heat-fixing apparatus of this invention can be preferably applied to a developer using the cycolor film such as cycolor type color video printer and a cycolor type color duplicator.

On the other hand, there may be provided another embodiment of heat-fixing apparatus for a color video printer according to this invention which causes the receiver paper to be electrified by using an electrification principle, then makes the electrified receiver paper to move along a predetermined paper feed loop in order to be heat-fixed, thereby improving the stability and the heat efficiency and also causing the color image of the receiver paper to be more uniformly heat-fixed.

Figure 8:
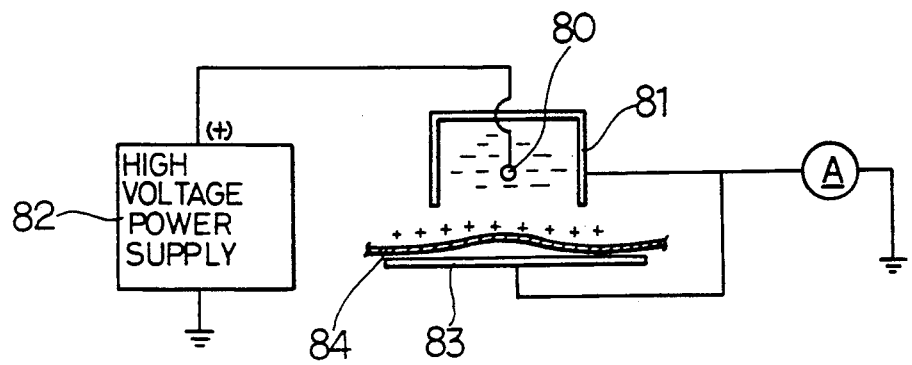
FIG. 8 is a schematic view showing a principle of an electrification which is able to be applied to another embodiment of heat-fixing apparatus in accordance with the present invention.

Referring to FIG. 8 which is a schematic view showing the electrification device which is applied to the another embodiment of the heat-fixing apparatus of this invention, the electrification device comprises a wire anode 80 (hereinafter referred to "the discharge wire") which is covered with a grounded discharge shield 81 and connected to a high voltage power supply 82. Here if the discharge wire 80 is applied with a high voltage of about 5000 V, the air insulation layer about the discharge wire 80 is broken in order to make the atmosphere of the discharge wire 80 to be ionized, thereby causing a receiver paper 84 moving on a paper feed guide member 84 to be electrified with a predetermined polarity, such as "+" polarity.

At this time, the discharge wire 80 is preferably disposed to be longitudinally located at a center of the discharge shield 81.

Figure 9:
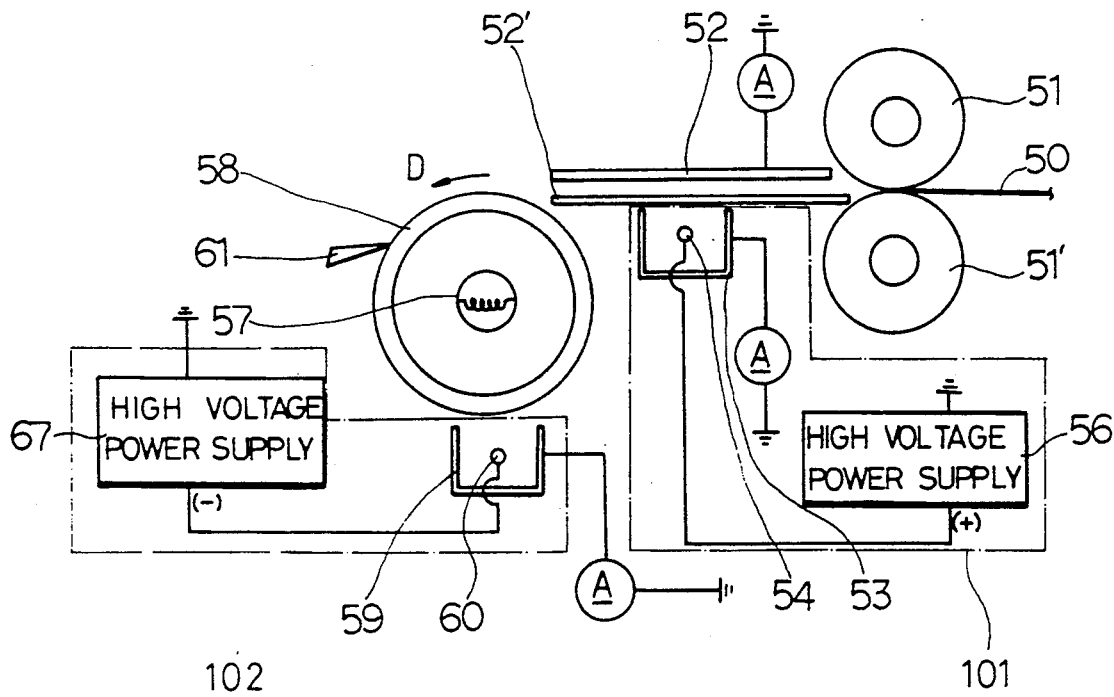
FIG. 9 is a side sectional view of the another embodiment of the heat-fixing apparatus using the electrification principle.
Figure 10:
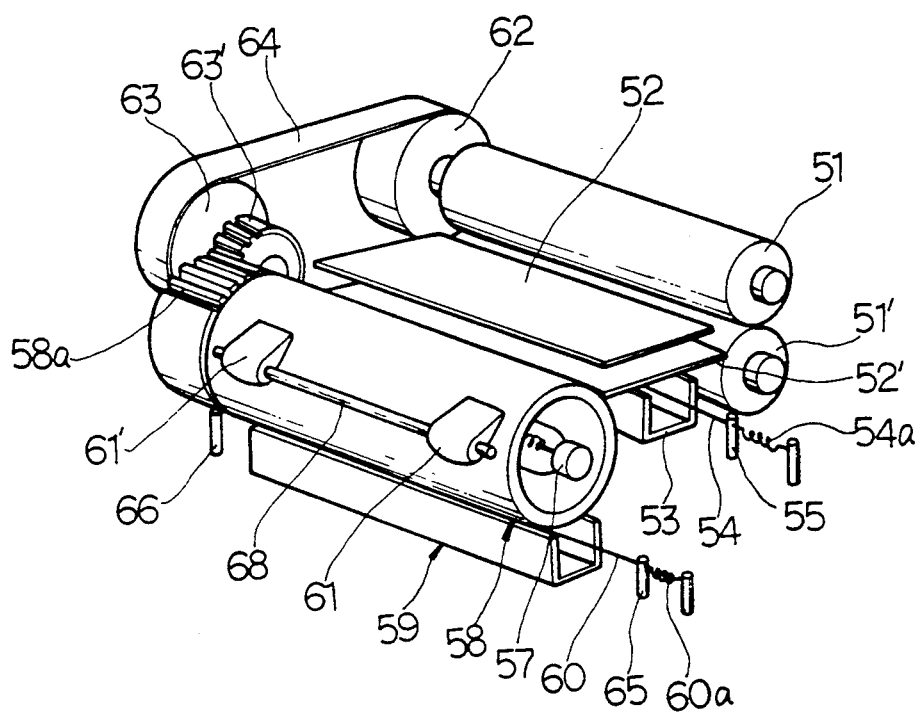
FIG. 10 is a perspective view of the still another embodiment of the heat-fixing apparatus of FIG. 9.

FIGS. 9 and 10 are a side sectional view and a perspective view of the another embodiment of the heat-fixing apparatus using the electrification principle of FIG. 9, respectively. As shown in the drawings, FIGS.

9 and 10, the heat-fixing apparatus comprises a pair of paper feed rollers 51 and 51' for feeding the receiver paper 50 and also performing the developing process for the receiver paper 50, upper and lower paper feed guide plate members 52 and 52' which are constructed of an insulation material, a heat roller 58 for heating the under surface of the receiver paper 50 in order to heat-fix the color image on the receiver paper 50, and enclosing a heat source 57 therein. In addition, there are provided a first electrification member 101 for electrifying the receiver paper 50 with a given polarity and a second electrification member 102 for electrifying the heat roller 58 with an opposite polarity to that of the receiver paper 50.

The first and second electrification members 101 and 102 comprises a pair of discharge shields 53 and 59 each having a U-shaped cross section, the one is disposed under the lower paper feed guide member 52' in order to be spaced therefrom by a predetermined distance, and the other is disposed under the heat roller 58 in order to be spaced therefrom by a predetermined distance. Also, each discharge shield 53, 59 encloses a longitudinal discharge wire 54, 60 at a center thereof. The discharge wires 53 and 60 are connected to high voltage power supplies 56 and 57, respectively, in order to be applied with each high voltage power having polarities different from each other.

The discharge wire 54 disposed at the paper feed guide plate member 52' is supported at both ends thereof by a pair of vertical supporters 55 (only one supporter shown in FIG. 10). Additionally, a tension member 54a is provided at an end of the discharge wire 54 in order to provide a tension for the discharge wire 54, thereby preventing the discharge wire 54 from drooping and also causing the discharge wire 54 to be tightly disposed across the longitudinal center of the discharge shield 53. The discharge wire 54 is additionally connected to the high voltage power supply 56 as described above, and the upper paper feed guide member 52 is grounded by way of a current supply A, thereby causing the receiver paper 50 moving through a space between the upper and lower paper feed guide plate members 52 and 52' to be electrified with a given polarity.

In the same manner, the discharge wire 60 disposed at the heat roller 58 is supported at both ends thereof by a pair of vertical supporters 65 and 66 and also is provided at an end thereof with a tension member 60a in order to be applied with a tension for preventing it from drooping and also causing it to be tightly disposed across the longitudinal center of the discharge shield 59. The discharge wire 60 is additionally connected to the high voltage power supply 67 as described above, thereby causing the heat roller 58 to be electrified with an opposite polarity to that of the receiver paper 50.

Additionally, the heat roller 58 is provided therein with the heat source 57 and also rotatably mounted. The separating members 61 and 61' disposed about both ends of the outer surface of the heat roller 58 are adapted for separating the receiver paper 50 from the heat roller 58 with which the receiver paper 50 closely contacts.

As shown in FIG. 10, the heat-fixing apparatus is additionally provided with a driving pulley 62 which is coaxially mounted on the upper paper feed roller 51, and a driven pulley 63 which is rotatably mounted in order to be spaced apart from the driving pulley 62 by a predetermined distance and connected to the driving pulley 62 by means of a belt 64. The driven pulley 63 is coaxially connected to a driven gear 63' which gears with a gear part 58a integrally formed at an end of the heat roller 58, thereby causing the upper paper feed roller 51 and the heat roller 58 to rotate in different directions from each other.

In FIGS. 9 and 10, the reference number 68 denotes a support bar for supporting the separating members 61 and 61' to maintain a predetermined contact position thereof with the outer surface of the heat roller 58.

Hereinafter, the operational effect of the heat-fixing apparatus shown in FIGS. 9 and 10 will be described in detail.

As shown in FIGS. 9 and 10, the receiver paper 50 having been processed at the developing process passes through the nip between the upper and lower paper feed rollers 51 and 51', then passes through the space between the upper and lower paper feed guide plate members 52 and 52' of the electrification device 100.

At this time, the discharge wire 54 of the guide members 52 and 52' is applied with a high voltage of "+" polarity by means of the high voltage power supply 56 so that the air insulation layer about the discharge wire 54 is broken due to the above-mentioned electrification principle, resulting in causing the peripheral atmosphere of the discharge wire 54 to be ionized. In result, the receiver paper 50 passing through the space between the upper and lower paper feed guide members 52 and 52' is electrified with the "+" polarity.

Thereafter, the receiver paper 50 electrified with the "+" polarity advances to a heat-fixing and paper discharging part C (see FIG. 9) of the heat-fixing apparatus. At this time, the driving pulley 62 of the upper paper feed roller 51 and the driven pulley 63 are connected to each other by means of the belt 64, and also the driven gear 63' of the driven pulley 63 gears with the gear part 58a of the heat roller 58 as described above, thus the heat roller 58 rotates in an opposite direction to that of the upper paper feed roller 51.

When the receiver paper 50 electrified with the "+" polarity advances to the heat roller 58, the discharge wire 60 of the heat roller 58 is applied with a high voltage of "−" polarity by means of the high voltage power supply 67 so that the heat roller 58 is electrified with the "−" polarity in accordance with the above-mentioned electrification principle.

Accordingly, simultaneously with closely contacting with the outer surface of the heat roller 58 which rotates in a direction shown at the arrow D of FIG. 9, the receiver paper 50 efficiently heated by the heat source 57 of the heat roller 58 in order to cause the color image thereon to be uniformly heat-fixed.

Here, the receiver paper 50 moves under the condition that it closely contacts with the outer surface of the heat roller 58 as described above, thus the heat-fixing apparatus of this invention is provided with no additional paper discharge roller, different from the prior art.

After having been heated by the heat source 57 of the heat roller 50, the receiver paper 50 is forcedly separated at the front end thereof from the outer surface of the heat roller 58 by means of the separating members 61 and 61' which are supported by the support bar 68, then discharged from the heat-fixing apparatus.

Figure 11:
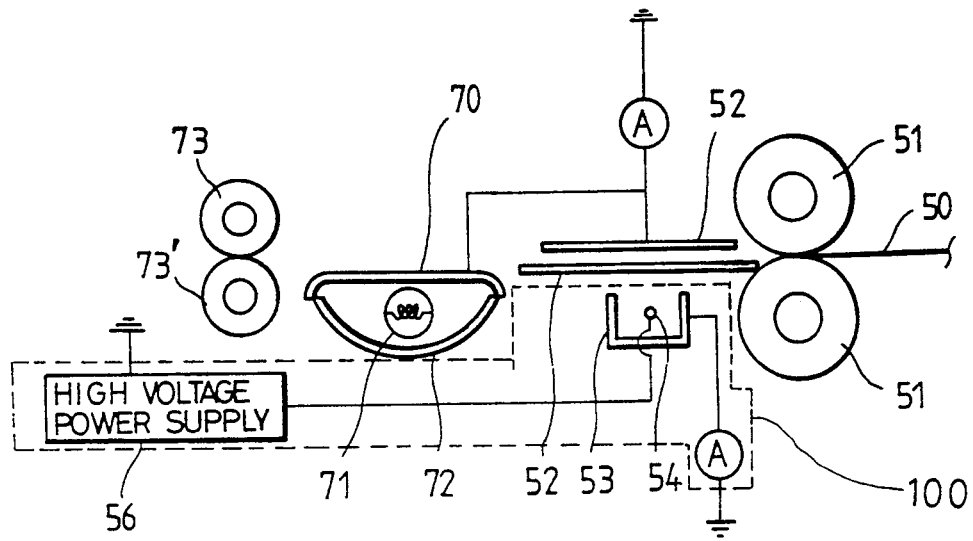
FIG. 11 is a side sectional view of heat-fixing apparatus having still another embodiment of a heating member in accordance with the present invention.
Figure 12:
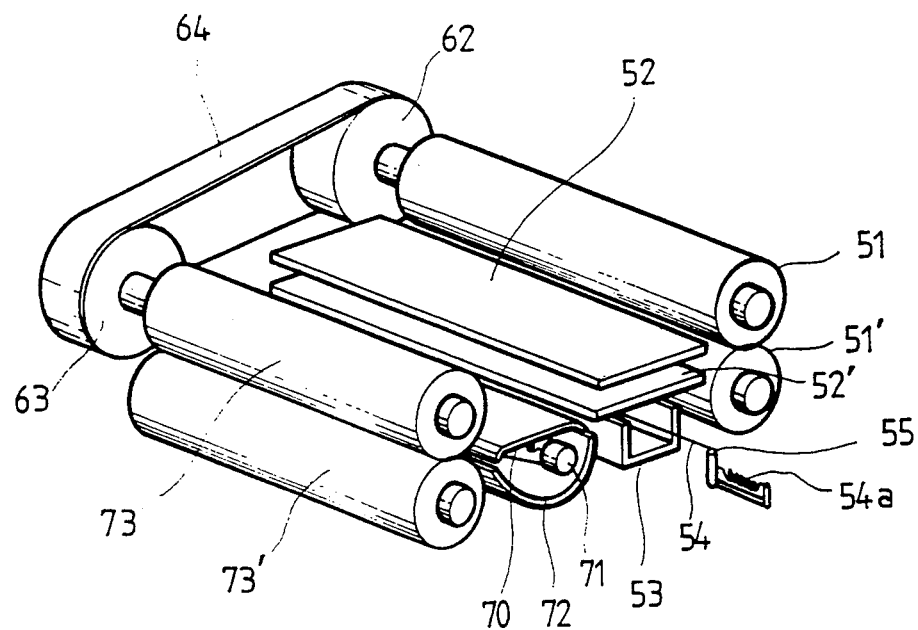
FIG. 12 is a perspective view of the heat-fixing apparatus of FIG. 11.

On the other hand, the present invention may provide still another embodiment of the heat-fixing apparatus for a color video printer in which the heating member comprises a stationary type heating member instead of the rotary type heat roller 58 of the above-mentioned embodiments, and also an electrification device corresponding to the stationary type heating member is provided, as shown in FIGS. 11 and 12.

Referring to the drawings, the heat-fixing apparatus is provided with the stationary type heating member which comprises a heat cover plate 70 for allowing the electrified receiver paper 50 to be parallel guided on the upper surface thereof, a heat source 71 longitudinally equipped under the heat cover plate 70 in order to be spaced apart therefrom by a predetermined distance, and a reflector 72 disposed under the heat source 71 in order to reflect the heat generated by the heat source 71. In addition, the heat-fixing apparatus includes upper and lower paper discharge rollers 73 and 73' for discharging the receiver paper 50 having passed on the heat cover plate 70. The upper paper discharge roller 73 is coaxially connected to the driven pulley 63 which is connected to the driving pulley 62 of the upper paper feed roller 51 by means of the belt 64, thereby having the same rotating direction as that of the upper paper feed roller 51.

On the other hand, an electrification device 100' is provided to electrify the receiver paper 50 with a predetermined polarity, and the heating member is constructed as only the heat cover plate 70 couples to ground.

Here, the same reference numbers of FIGS. 11 and 12 as those of FIGS. 9 and 10 denote the same elements as those of the embodiment of the heat-fixing apparatus of FIGS. 9 and 10.

If briefly described, the heat-fixing apparatus of FIGS. 11 and 12 is constructed such that it is provided with the heat cover plate 70 coupling to ground, and the upper and lower paper discharge rollers 73 and 73', thereby making the electrified receiver paper 50 to closely contact with the upper surface of the grounded heat cover plate 70 without oppositely electrifying the heating member including the heat cover plate 70. In result, the receiver paper 50 having passed through the paper electrification part B is heat-fixed by the heat source 71 of the heating member when it moves on the grounded heat cover plate 70, then discharged from the heat-fixing apparatus by the paper discharge rollers 73 and 73' which rotate in opposite directions from each other.

As described above, the heat-fixing apparatus using the electrification principle in accordance with the present invention is constructed such that the electrified receiver paper 50 is forced to closely contact with the heating member, thereby improving the heat efficiency and the stability of the heat-fixing operation as the under surface contact type embodiment of the heat-fixing apparatus of this invention, and also allowing the receiver paper 50 to uniformly contact with the heating member, thus accomplishing the uniformity of the heat-fixing result.

On the other hand, the present invention may provide still another embodiment of the heat-fixing apparatus for a color video printer in which the receiver paper closely contacts with the heating member in order to be uniformly heated, then easily separated from the heating member.

Figure 13:
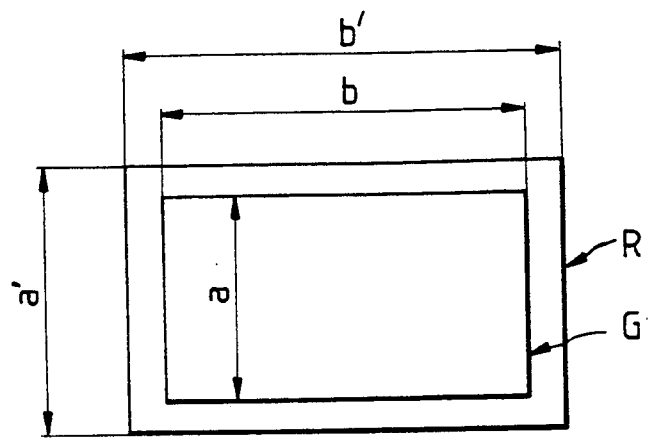
FIG. 13 is a schematic view showing a size of a color image which is printed on a conventional receiver paper.

Referring to FIG. 13 showing a size of a color image which is printed on the receiver paper, the size of the conventional receiver paper R is a'×b', and the size of the color image transferred part G on which the color image is transferred is a×b, thereby causing a margin of (a'−a)/2 to remain at each side of the receiver paper.

In accordance with this invention, the heat-fixing apparatus may constructed such that it makes the receiver paper R to move and also closely contact with the heating member under the condition that each margin of (a'−a)/2 of the receiver paper is insulated.

Figure 14:
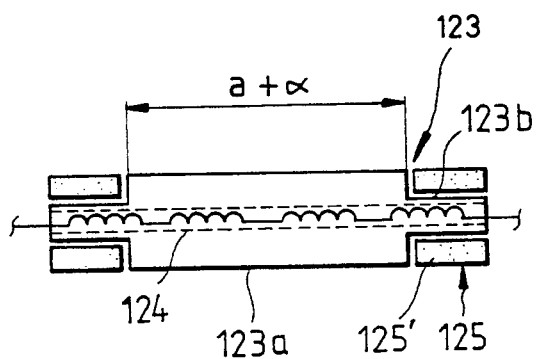
Figure 15:
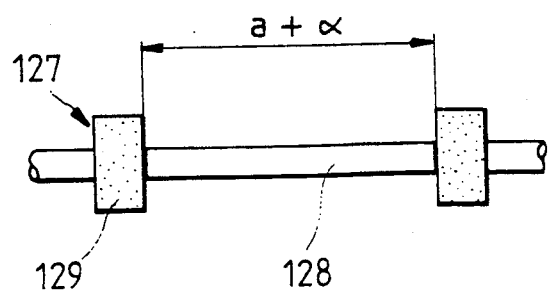

FIGS. 14 and 15 show constructions of a heat roller and a compression roller of the above heat-fixing apparatus, respectively.

As shown in FIG. 14, the heat roller 123 is provided with a pair of steps 123b, that is, smaller diameter parts, formed at opposite ends of a center contact part 123a. Each step 123b is formed to provide an insulation part 125.

The center contact part 123a is constructed such that it has a length slightly longer than the width size "a" of the color image transferred part G of the receiver paper R by a width "α", thereby having the length of α+α. In addition, the insulation part 125 results from applying an insulation material 125' to the step 123b.

Here, the insulation material 125' may be applied to each step 123b in such a manner that it is previously formed as having an annular shape, then inserted onto the step 123b, or it is directly applied onto the step 123b in order to form a coating layer thereon. In addition, the insulation material 125' may be selected from a good insulation material, such as a heat resisting rubber and asbestos, and is formed as having the same outer diameter as that of the center contact part 123a of the heat roller 123.

Turning to FIG. 15, the compression roller 127 is constructed to have a pair of compression parts 129 provided at both ends of a shaft 128. The compression parts 129 are constructed such as of a heat resisting silicon rubber, and disposed with respect to the shaft 128 in order to be spaced apart from each other by a predetermined distance of a +α, thereby efficiently compressing the receiver paper R without contacting with the color image transferred part G of the receiver paper R.

Figure 16:
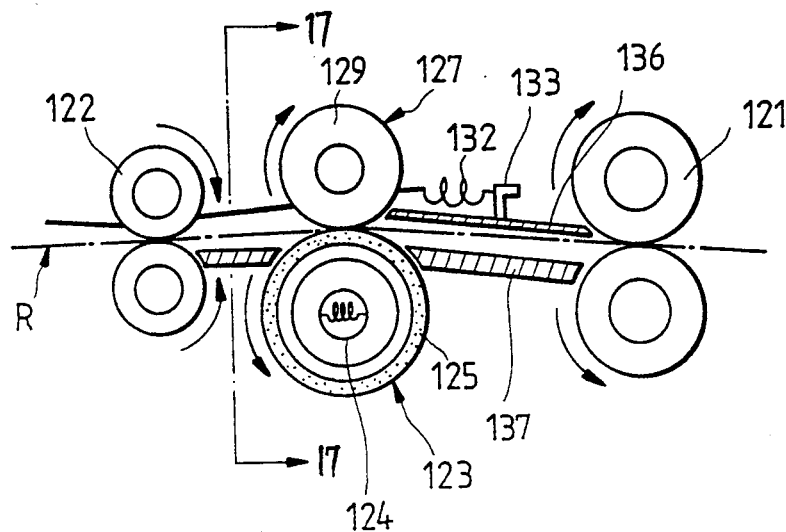
Figure 17:
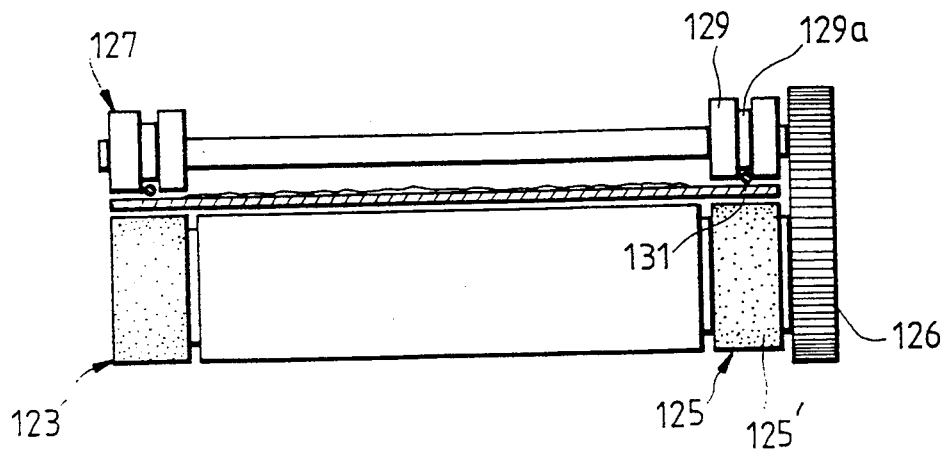
Figure 18:
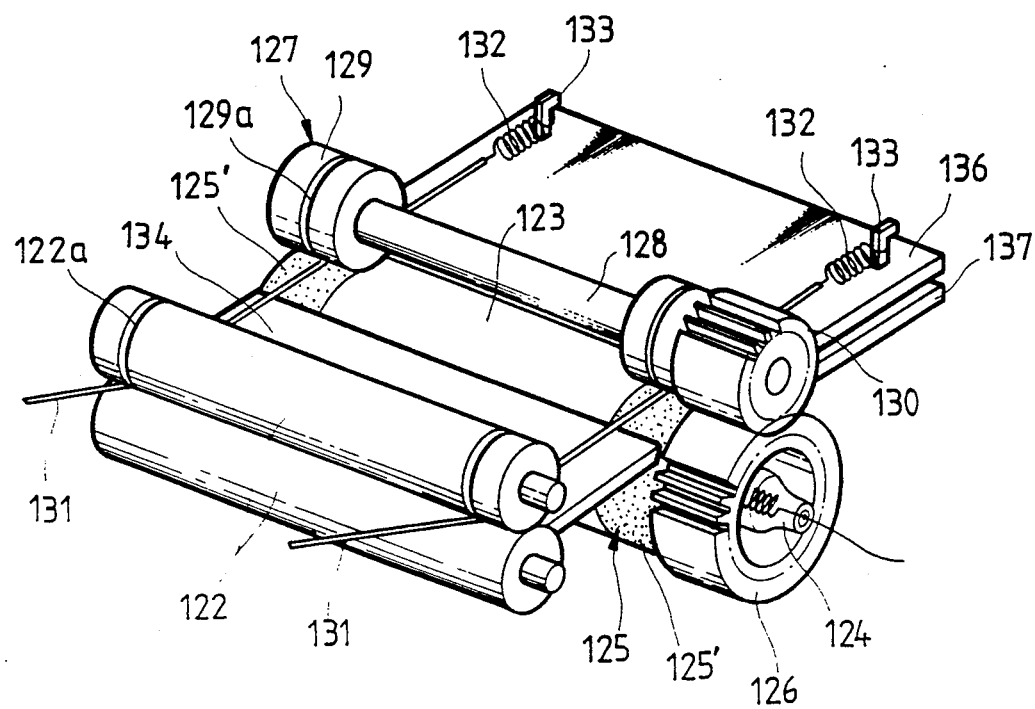

FIG. 16 is a cross-sectional view of still another embodiment of the heat-fixing apparatus of this invention, FIG. 17 is a sectional view taken along the sectioned line 17—17 of FIG. 16, and FIG. 18 is a perspective view of the heat-fixing apparatus of FIG. 16.

As shown in the drawings, the heat-fixing apparatus comprises a heat roller 123 which encloses therein a heat source 124 and disposed between the developing rollers 121 and the paper discharge rollers 122. The heat roller 123 comprises the center contact part 123a and the insulation parts 125 which are disposed at both ends of the center contact part 123a and contact with the margins of the receiver paper R. In addition on the heat roller 123, there is provided the compression roller 127 comprising the shaft 128 and the compression parts 129 disposed at both ends of the shaft 128 and adapted for compressing the margins of the receiver paper R. In result, the receiver paper R moves on the heating member under the condition that each margin thereof closely engages with the compression part 129 of the compression roller 127 and the insulation part 125 of the heat roller 123.

On the other hand, the compression parts 129 of the compression roller 127 and the upper paper feed roller 122 are provided at the circumferential outer surfaces thereof with annular grooves 129a and 122a for allowing wires 131 to pass therethrough, respectively. The wires 131 are adapted for guiding both margins of the receiver paper R on the heat roller 123 and the lower paper discharge roller 122, and pass through the annular grooves 122a and 129a of the upper paper discharge roller 122 and the compression roller 129. Each wire 131 is connected at an end to a predetermined position (not shown) and at the other end to a predetermined position by means of a tension coil spring 132. Additionally, the heat roller 123 and the compression roller 127 are provides with at respective ends driving gears 126 and 130 which engage with each other.

In FIG. 18, the reference numbers 134, 135 and 136 denote paper feed guide plate members, respectively, and the reference number 133 denotes a supporter for supporting a free end of the tension coil spring.

In operation of the heat-fixing apparatus of the above-mentioned construction, the receiver paper R having passed through the developing rollers moves between the rotating heat roller 123 and the rotating compression roller 127 as shown in FIG. 16. At this time, the heat roller 123 has the pair of steps 123b which are formed at both ends thereof and provide the insulation parts 125 as described above, thus only a part of the receiver paper R on which the color image has been transferred, that is, only the color image transferred part G is heated in order to cause the resin layer thereon to be fused. In result, the fused resin layer on the color image transferred part G results upon the dyestuffs of the color image so as to cause the color image to be developed. On the other hand, the insulation parts 125 of the heat roller 123 appears a temperature lower than the fusing temperature of the resin layer of the receiver paper R, thereby causing the resin layer of a part of the receiver paper R contacting therewith not to be fused, thus preventing the receiver paper R from sticking to the compression roller 127.

Additionally, the compression parts 129 of the compression roller 127 and the upper paper discharge roller 122 are provided with the annular grooves 129a and 122a, respectively, and also the wires 131 are installed in order to pass through the annular grooves 129a and 122a as described above. Thus, even though the receiver paper R moves under the condition of undesirably sticking to the compression roller 127 and the upper paper discharge roller 122, it can be easily separated from the rollers 127a and 122 by means of the wires 131 and also stably guided by the wires 131. That is, the receiver paper R is fed between the wires 131 and the paper feed guide members 134, 135 and 136 under the condition that the margins thereof forcedly contacts with heat roller 123 by the compression roller 127, then stably discharged from the heat-fixing apparatus by the paper discharge rollers 122.

As described above, in the above-mentioned heat-fixing apparatus according to this invention, the receiver paper R is fed under the condition that the margins thereof forcedly contacts with heat roller 123 by the compression roller 127. In result, the heat-fixing apparatus provides advantage in that it reliably prevents a rolling of the receiver paper R and occurrence of a bad contact of the receiver paper R with the heat roller 123 due to an elasticity of the receiver paper R. Furthermore, the heat-fixing apparatus is equipped with the wires 131 passing between the compression roller 127 and the heat roller 123, thereby providing another advantage in that it accomplishes a simple and stable separation of the receiver paper R from the compression roller 127 and also provides a good guidance for the receiver paper R, thus efficiently prevents a paper jam and also accomplishes a simple construction.

Figure 19:
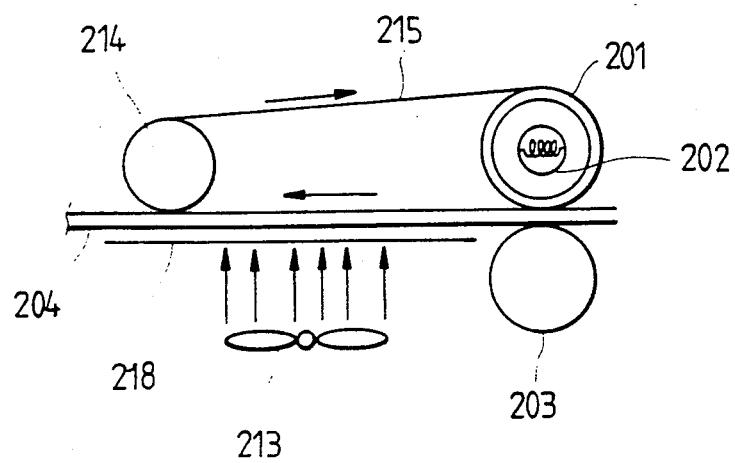
FIG. 19 is a schematic view showing a belt contact type heat-fixing principle in accordance with the present invention.

On the other hand, the present invention may provide still another embodiment of the heat-fixing apparatus using an endless plate belt for accomplishing the stable heat-fixing operation as shown in FIG. 19.

As shown in the drawing, the heat-fixing apparatus is constructed such that a receiver paper 204 is fed between a compression roller 203 and a heat roller 201 enclosing therein a heat source 202, then passes through a space between a lower paper feed guide plate member 218 and an endless plate belt 215 being connected between the heat roller 201 and a belt guide roller 214. Here during the movement, the receiver paper 204 is compressed by the compression roller 203 in order to closely contact with the endless plate belt 215, thereby causing the cylith capsules on the receiver paper 204 to be broken by a pressure generated by the belt 215. Thereafter, the receiver paper 204 moves through the space between the endless plate belt 215 and the paper feed guide plate member 218. At this time, the receiver paper 204 is cooled by an air current circulated by a blower 213, thereby causing the dyestuffs thereon to be cooled and stably fixed.

Figure 20:
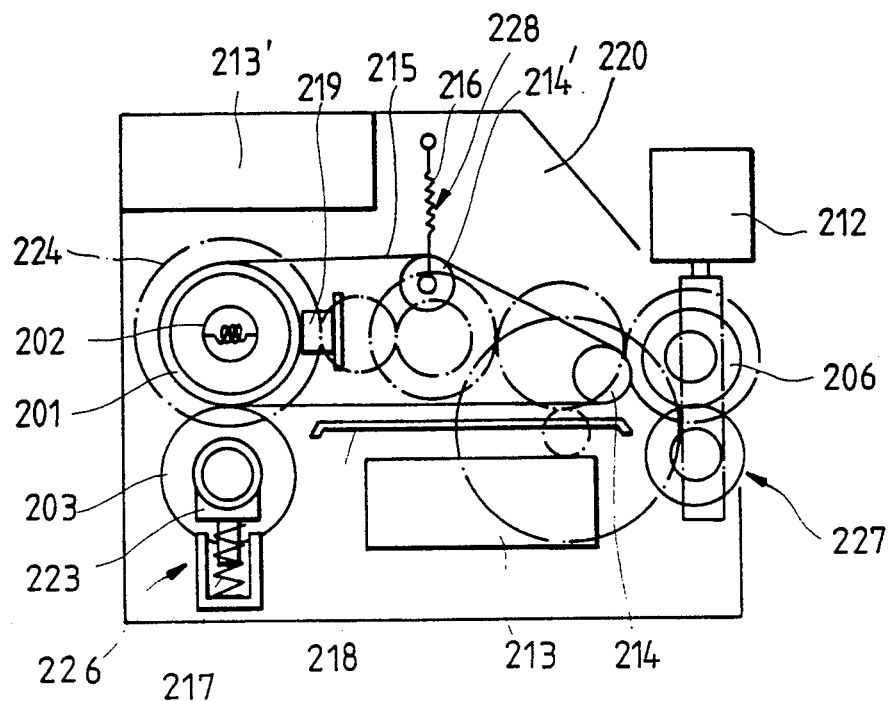
Figure 21:
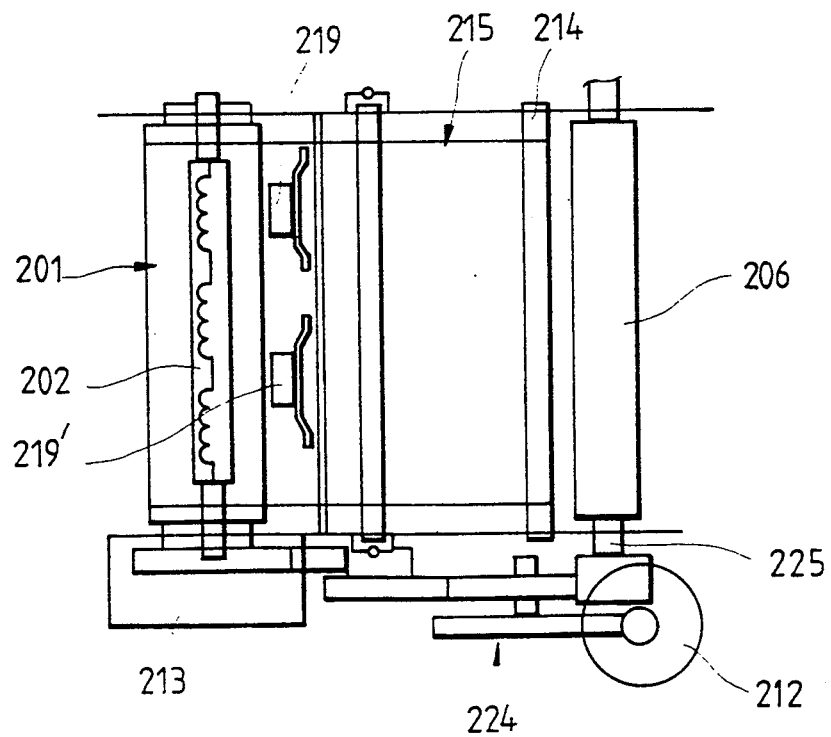
Figure 22:
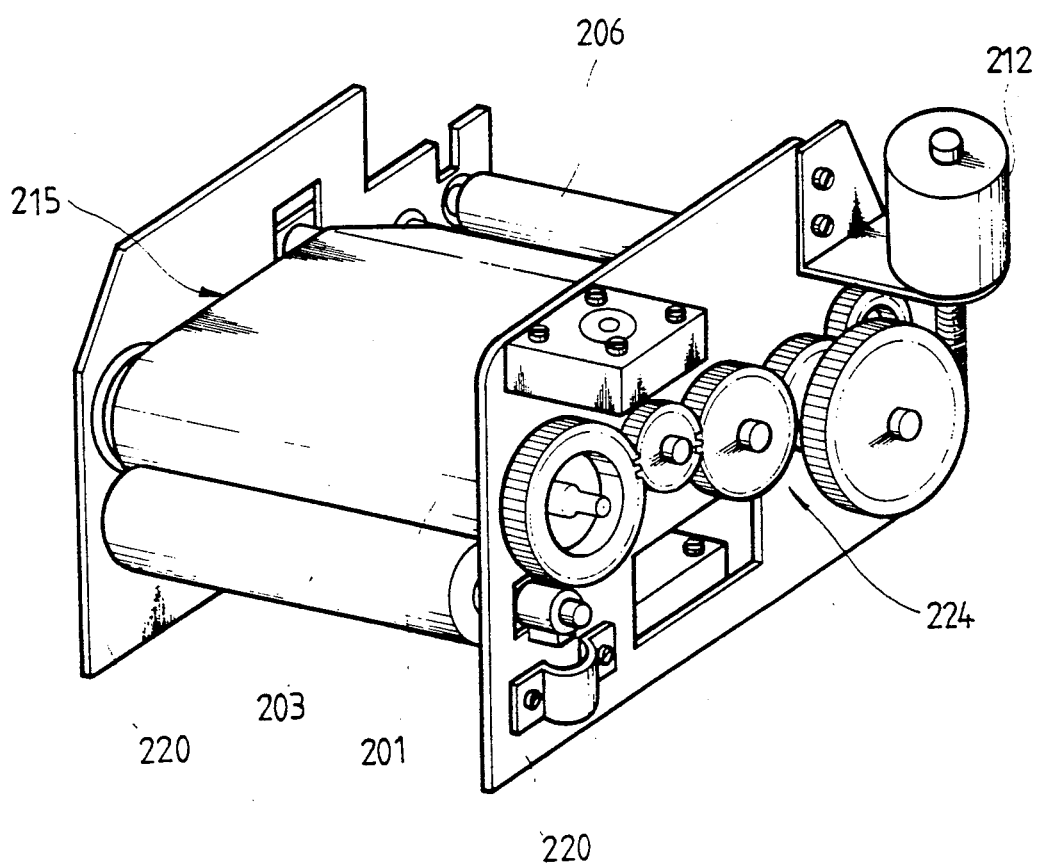

FIGS. 20 to 22 are views of an embodiment of the above-mentioned belt type heat-fixing apparatus in accordance with the present invention, respectively, in which FIG. 20 is a sectional view, FIG. 21 is a plane view, and FIG. 22 is a perspective view. As shown in the drawings, the belt type heat-fixing apparatus comprises the heat roller 201 enclosing a heat source 202, and the compression roller 203 for compressing the receiver paper 204 to the heat roller 201 at a time of initial feeding of the receiver paper 204, the rollers 201 and 203 being mounted on a main bracket 220 in order to closely engage with each other. In addition, there is provided the belt guide roller 214 which is disposed in order to be spaced apart from the heat roller 201 by a predetermined distance. The endless plate belt 215 is connected between the heat roller 201 and the belt guide roller 214, and a paper feed roller 206 is provided at a side of the belt guide roller 214. The compression roller 203 is upwardly biased by a compression member 226 in order to be closely contact at the upper end thereof with the lower end of the heat roller 201. On the other hand, the paper feed guide plate member 218 is disposed between the compression roller 203 and the belt guide roller 214, and the blower 213 is disposed under the paper feed guide plate member 218. In addition, the heat-fixing apparatus is provided with another blower 213' which is disposed above the heat roller 201 in order to cool the receiver paper 204 after being processed at the heat-fixing process, a driving motor 212 for driving the heat roller 201 and a power transmission member 227 for transmitting the driving power from the driving motor 212 to the roller system.

Additionally, a main temperature sensor 219 is provided at a side of the heat roller 201 in order to cause the heat-fixing temperature of the heat roller 201 to be maintained at a predetermined temperature, and a temperature control circuit 221 is provided for automatically cutting off the power supply when the heat roller 201 is overheated.

Here, the endless plate belt 215 is always controlled by a tension control member 228 in order to be maintained at a predetermined tension.

The compression member 226 comprises a shaft bearing 223 for supporting the opposite ends of the shaft of the compression roller 203 and a compression coil spring 217 for elastically upwardly biasing the shaft bearing 223.

The power transmission member 227 comprises a worm secured to a driving shaft of the driving motor 212, a power transmission gear train 224 engaging with the worm. On the other hand, a clutch gear 225 is provided at an end of the shaft of the paper feed roller 206 in order to make the paper feed roller 206 to rotate at the same rotating velocity as that of the heat roller 201.

The tension control member 228 comprises a tension coil spring 216 which is connected at an end to the main bracket 220 and at the other end to a shaft of a tension roller 214', thereby upwardly biasing the tension roller 214'.

Figure 23:
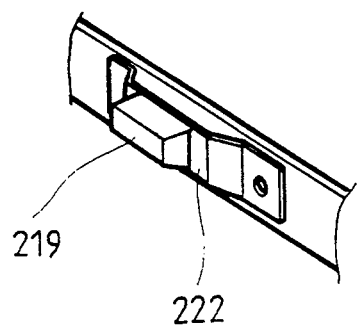
FIG. 23 is a perspective view of an embodiment of a mounting member for mounting a temperature sensor of the heat-fixing apparatus for color video printer in accordance with the present invention.

As shown in FIG. 23, the main temperature sensor 219 is mounted on a plate spring 222 in order to be biased to the outer surface of the heat roller 201. In addition, there is provided an additional temperature sensor 219', as shown in FIG. 21, for being selectively used such as when the main temperature sensor 219 is out of order.

The temperature control circuit 221 is constructed such as it controls the driving temperature of the heat source 202 in accordance with a temperature of the heat roller 201 sensed by the temperature sensor 219, and also cuts off the heat source 202 in case of occurrence of an overheat on the heat roller 201.

Figure 24:
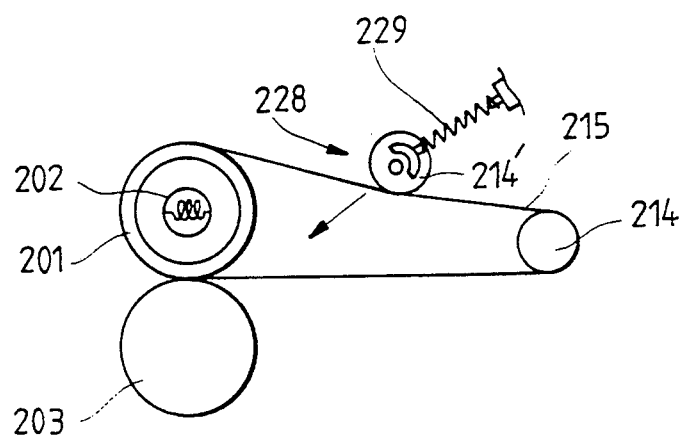
FIG. 24 is a sectional view of an embodiment of a tension control member of the belt contact type heat-fixing apparatus for color video printer in accordance with the present invention.

As shown in FIG. 24 showing another embodiment of the tension control member 228 of this invention, the tension control member 228 may comprise an elastic member 229, such as a compression coil spring, for downwardly biasing the tension roller 214'.

On the other hand in the above-mentioned belt type heat-fixing apparatus of this invention, the endless plate belt 215 is formed as having a more smooth surface than that of the receiver paper 204. Here, the dyestuff of the color image on the receiver paper 204 is fused by virtue of the heat of the heat roller 201 when the receiver paper 204 passes through the nip between the heat roller 201 and the compression roller 203, thereby sticking to both the plate belt 215 wrapping about the heat roller 201 and the receiver paper 204. Thereafter, the receiver paper 204 is cooled by the cooling air circulated by the blower 213 so that the dyestuffs is also cooled in order to be hard. At this time, the plate belt 215 has the more smooth surface than that of the receiver paper 204 as described above, thus the sticking power between the dyestuff and the smooth surface of the plate belt 215 is relatively lower than that between the dyestuffs and the receiver paper 204, thereby causing the dyestuff to be easily separated from the plate belt 215 and also to be fixed on the receiver paper 204.

The heat roller 201 is constructed of a good heat transferring material, and the plate belt 215 is constructed of a heat resisting and flexible material.

Hereinafter, the operational effect of the above-mentioned belt type heat-fixing apparatus will be described in detail.

When the heat roller 201 is preheated to a predetermined temperature by applying an electric power to the heat source 202 of the heat roller 201, the temperature sensor 219 senses the temperature of the heat roller 201 and outputs a sensed temperature signal representing the sensed temperature to the temperature control sensor 221. Upon receiving the signal, the temperature control circuit 221 generates a temperature control signal, and applies the signal to a system controller (not shown) which outputs a print start command signal in accordance with the temperature control signal, thereby causing the heat-fixing part of the heat-fixing apparatus to be driven. On the other hand, the temperature control circuit 221 controls the operation of the heat source 202 in accordance with the sensed temperature signal of the temperature sensor 219, thereby making the heat-fixing temperature of the heat roller 201 to be maintained at the predetermined temperature.

Also, the driving motor 212 is applied with electric power in order to generate the driving power which is transmitted to the heat roller 201 and the compression roller 203 by way of the power transmission member 227, thereby causing the heat roller 201 and the compression roller 203 to rotate, respectively. At this time, the heat roller 201 and the compression roller 203 rotate at the same rotating velocity by addition of the clutch gear 225.

When the receiver paper 204 having precessed at the developing step by the developing rollers is fed to the heat-receiver paper 204 to the plate belt 215, thereby causing the upper surface of the receiver paper 204 to closely contact with the plate belt 215. At this time, the plate belt 215 revolves about the heat roller 201 and the belt guide roller 214 due to the rotation of the heat roller 201, and the heat roller 201 heats the receiver paper 204, thus the receiver paper 204 moves along with the plate belt 215 under the condition that the dyestuff of the color image thereon is fused in order to stick to the plate belt 215.

During such a movement of the receiver paper, the blower 213 circulates the air current in order to cool the receiver paper 204 and the plate belt 215 so that the fused dyestuff on the receiver paper 204 is also cooled in order to be hard, and again sticks to the receiver paper 204. Thereafter, the receiver paper 204 is separated from the plate belt 215 at the position of the belt guide roller 214, and fed to the nip between the paper feed rollers 206, then discharged from the heat-fixing apparatus, thereby causing the heat-fixing operation to be accomplished.

After accomplishing the heat-fixing operation, the system controller drives the another blower 213' disposed above the heat roller 201 in order to cool the heat roller 201.

In accordance, the above-mentioned belt type heat-fixing apparatus of this invention prevents occurrence of an offset of the dyestuff of the receiver paper 204, and performs the heat-fixing operation for the receiver paper 204 under the condition that the endless plate belt 215 closely contact with the upper surface of the receiver paper 204, thereby providing an advantage in that it provides a clear, uniform and highly lustrous color image and also accomplishes a rapid heat-fixing operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper, thereby heat-fixing the image which has been developed on said receiver paper, wherein said heating means is a combination of a planar heat cover on a hemispherical heat cover, said heating means including a stationary heat tube enclosing a heat source therein; and receiver paper feeding and discharging means for feeding the receiver paper to the heating means after said receiver paper has been processed by the developing process, under the condition that said under surface of the receiver paper is in contact with said heating means, and for discharging the receiver paper which has been processed by the heat-fixing process.

2. A heat-fixing apparatus for a color video printer according to claim 1, wherein said heat tube is elliptical.

3. A heat-fixing apparatus for a color video printer according to claim 1, wherein said heat-fixing apparatus further comprises:

a temperature control member for controlling the temperature of said heating means in order to cause said heating means to remain at a predetermined temperature.

4. A heat-fixing apparatus for a color video printer according to claim 3, wherein said temperature control member comprises:

a temperature sensor member for sensing the temperature of said heating means, said sensor member being disposed to contact said heating means under bias of a spring member; and a temperature control circuit for controlling the temperature of said heating means in accordance with the temperature of said heating means which is sensed by said temperature sensor member, thereby causing said heating means to remain at said predetermined temperature.

5. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper thereby heat-fixing the image which has been developed on said receiver paper said heating means including a stationary heat tube enclosing a heat source therein, said heating means coated, at a portion thereof which contacts with said receiver paper, with a PTFE insulation material at the other portion thereof which does not contact with said receiver paper; and receiver paper feeding and discharging means for feeding the receiver paper to the heating means after said receiver paper has been processed by the developing process, under the condition that said under surface of the receiver paper is in contact with said heating means, and for discharging the receiver paper which has been processed by the heat-fixing process.

6. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper thereby heat-fixing the image which has been developed on said receiver paper said heating means including a stationary heat tube enclosing a heat source therein;

receiver paper feeding and discharging means for feeding the receiver paper to the heating means after said receiver paper has been processed by the developing process, under the condition that said under surface of the receiver paper is in contact with said heating means, and for discharging the receiver paper which has been processed by the heat-fixing process; and an additional heat source which is disposed above said heating means in order to selectively generate additional heat; and a blower for selectively providing a hot air current for the upper surface of said receiver paper when said receiver paper is processed by said heat-fixing process, and for selectively providing a cooling air current for cooling said receiver paper after being processed by the heat-fixing process.

7. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper, thereby heat-fixing the image which has been developed on said receiver paper, said heating means including a rotary heat roller enclosing a stationary heat tube with a heat source therein; and receiver paper feeding and discharging means for feeding the receiving paper to the heating means after said receiver paper has been processed by the developing process, under the condition that said under surface of the receiver paper is in contact with said heating means, and for discharging the receiver paper which has been processed by the heat-fixing process, said receiver paper feeding and discharging means including.

upper and lower paper feed guide plate members for guiding the receiver paper, after said receiver paper has been processed by said developing process, to an upper surface of said heating means;

a first electrification member for electrifying said receiver paper with a predetermined polarity in order to make the under surface of said receiver paper contact a paper contact part of said heating means;

a second electrification member for electrifying said heating means with an opposite polarity to said predetermined polarity of said receiver paper; and paper separating members for separating said receiver paper, which has been processed by the heat-fixing process, from said heating means and for then discharging said receiver paper.

8. A heat-fixing apparatus for a color video printer according to claim 7, wherein said first electrification member comprises:

a discharge shield for concentrating discharge ions and electrifying said receiver paper which is fed between said upper and lower paper feed guide plate members;

a discharge wire for performing a discharge by a high voltage from a high voltage power supply, said discharge wire being disposed at a center of said discharge shield: and grounding means for coupling said discharge shield and said upper paper feed guide plate member to ground.

9. A heat-fixing apparatus for a color video printer according to claim 7, wherein said second electrification member comprises:

a discharge shield for concentrating discharge ions and electrifying said heating means;

a discharge wire for performing a discharge by a high voltage from a high voltage power supply, said discharge wire being disposed at a center of said discharge shield; and grounding means for coupling said discharge shield to ground.

10. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper, thereby heat-fixing the image which has been developed on said receiver paper, said heating means including a stationary heat tube enclosing a heat source therein; and receiver paper feeding and discharging means for feeding the receiver paper to the heating means after said receiver paper has been processed by the developing process, under the condition that said under surface of the receiver paper is in contact with said heating means, and for discharging the receiver paper which has been processed by the heat-fixing process, said receiver paper feeding and discharging means including, upper and lower paper feed guide plate members for guiding the receiver paper, after said receiver paper has been processed by said developing process, to an upper surface of said heating means;

an electrification member for electrifying said receiver paper with a predetermined polarity in order to make the under surface of said receiver paper contact a paper contact part of said heating means; and upper and lower paper discharge rollers for forcibly drawing the receiver paper having been processed by said heat-fixing process, and for separating said receiver paper from said heating means in order to discharge said receiver paper from said heat-fixing apparatus.

11. A heat-fixing apparatus for a color video printer according to claim 10, wherein said electrification member comprises:

grounding means for coupling said upper paper feed guide plate member and said paper contact part of the heating means to ground;

a discharge shield for concentrating discharge ions and electrifying said receiver paper which is fed between said upper and lower paper feed guide plate members; and a discharge wire for performing the discharge by a high voltage from a high voltage power supply, said discharge wire being disposed at the center of said discharge shield.

12. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper, thereby heat-fixing the image which has been developed on said receiver paper, said heating means including a rotary heat roller enclosing a stationary heat tube with a heat source therein; and receiver paper feeding and discharging means for feeding the receiver paper to the heating means after said receiver paper has been processed by the developing process, under the condition that said under surface of the receiver paper is in contact with said heating means, and for discharging the receiver paper which has been processed by the heat-fixing process, said receiver paper feeding and discharging means including, upper and lower paper feed guide plate members for guiding the receiver paper to a contact part of said heat roller;

a lower paper discharge guide plate member for guiding discharge of said receiver paper to a position below said contact part of the heat roller;

an insulation part for insulating a part of said heat roller in order to cut off heat transfer to margins of said receiver paper, said insulation part being integrally formed with said heat roller and having the same outer diameter as that of a center contact part of the heat roller;

a compression roller for making said margins of the receiver paper closely contact said insulation part of the heat roller, said compression roller being disposed on said heat roller;

upper and lower discharge rollers for discharging the receiver paper which has been processed by said heat-fixing process and guided by said lower paper discharge guide plate member; and paper discharge guide means for automatically separating said receiver paper which has passed through said paper discharge rollers form said paper discharge rollers, and for discharging said receiver paper from the heat-fixing apparatus.

13. A heat-fixing apparatus for a color video printer according to claim 12, wherein said insulation part of the heat roller comprises;

a pair of steps integrally formed at both ends of said center contact part of the heat roller in order to have a predetermined diameter; and an annular insulation member for each said step, said insulation member being formed to have the same diameter as that of said center contact part of the heat roller.

14. A heat-fixing apparatus for a color video printer according to claim 12, wherein said compression roller comprises:

a pair of compression parts for pressing said margins of the receiver paper to said insulation part of the heat roller, thereby making said margins contact the insulation part of the heat roller; and a shaft for supporting said compression parts in order to provide a predetermined interval between the compression parts, said interval being longer than a width of an image transferred part of said receiver paper.

15. A heat-fixing apparatus for a color video printer according to claim 12, wherein said paper discharge guide means comprises:

annular wire grooves formed on outer surfaces of said compression parts of the compression roller and said upper paper feed roller, respectively;

a wire being disposed to pass through each said annular wire groove, and being connected with one end thereof at a predetermined position of said paper discharge rollers, for separating said receiver paper from said compression roller and said upper paper discharge roller and guiding said receiver paper to be discharge from the heat-fixing apparatus;

a spring member having one end connected to the other end of said wire in order to provide an elastic force for said wire; and a spring supporter for supporting the other end of said spring member at a predetermined position.

16. A heat-fixing apparatus for performing a heat-fixing process in a color video printer after a receiver paper, having an upper surface and an under surface, has undergone a developing process for developing an image on the receiver paper, said apparatus comprising:

heating means for heating the under surface of the receiver paper, thereby heat-fixing the image which has been developed on said receiver paper, said heating means including a rotary heat roller enclosing a stationary heat tube with a heat source therein; and receiver paper feeding and discharging means for feeding the receiver paper to the heating means after said receiver paper has been processed by the developing process, under the condition that said under surface of the receiver paper is in contact with said heating means, and for discharging the receiver paper which has been processed by the heat-fixing process, said receiver paper feeding and discharging means including, a belt guide roller spaced apart from said heat roller by a predetermined distance;

an endless plate belt connected between said belt guide roller and said heat roller;

a compression roller for pressing an image transferred part of said receiver paper to said endless plate belt and for causing the receiver paper to wrap about said heat roller in response to a biasing force of a compression member;

a paper feed guide plate member for supporting said receiver paper to closely in contact with said endless plate belt between said heat roller and said belt guide roller;

a blower for circulating an air current at a lower part of said paper feed guide plate member in order to cool said receiver paper; and power transmission means for driving said heat roller, said belt guide roller and said compression roller.

17. A heat-fixing apparatus for a color video printer according to claim 16, wherein said heat-fixing apparatus further comprises:

a temperature sensor member for sensing the temperature of said heat roller; and a temperature control circuit for controlling the temperature of said heat roller in accordance with the temperature of the heat roller sensed by said temperature sensor member, thereby causing the heat roller to be maintained at a predetermined temperature.

18. A heat-fixing apparatus for a color video printer according to claim 17, wherein said temperature sensor member includes:

a plate spring for biasing said temperature sensor member to an outer surface of said heat roller; and an additional temperature sensor for use when said temperature sensor member is out of order.

19. A hear-fixing apparatus for a color video printer according to claim 16, wherein said compression member of the compression roller comprises:

a shaft bearing for supporting opposite ends of a rotating shaft of said compression roller; and a spring member for upwardly biasing said shaft bearing.

20. A heat-fixing apparatus for a color video printer according to claim 16, wherein said power transmission means comprises:

a worm being mounted to a driving shaft of a driving motor;

a power transmission gear train engaging with said worm; and a clutch gear being disposed at an end of a rotating shaft of a paper feed roller in order to make said paper feed roller rotate at the same rotating velocity as that of said heat roller.

21. A heat-fixing apparatus for a color video printer according to claim 16, wherein said endless plate belt is formed with a surface more smooth than that of said receiver paper.

22. A heat-fixing apparatus for a color video printer according to claim 16, wherein said heat-fixing apparatus further comprises:

a tension control member for controlling the tension of said endless plate belt, thereby causing said endless plate belt to be maintained at a predetermined tension.

23. A heat-fixing apparatus for a color video printer according to claim 16, wherein said tension control member comprises:

a tension roller for upwardly biasing said endless plate belt; and a spring member for upwardly biasing said tension roller.

24. A heat-fixing apparatus for a color video printer according to claim 16, wherein said tension control member comprises:

a tension roller for downwardly biasing said endless plate belt; and a spring member for downwardly biasing said tension roller.

* * * * *